United States Patent
Lin et al.

(10) Patent No.: US 11,036,959 B2
(45) Date of Patent: Jun. 15, 2021

(54) DISPLAY DEVICE

(71) Applicant: Xiamen Tianma Micro-Electronics Co., Ltd., Xiamen (CN)

(72) Inventors: Limin Lin, Xiamen (CN); Yongjin Teng, Xiamen (CN); Yingzhang Qiu, Xiamen (CN); Limei Shen, Xiamen (CN); Huifang Zhou, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/680,461

(22) Filed: Nov. 11, 2019

(65) Prior Publication Data

US 2020/0082144 A1    Mar. 12, 2020

(30) Foreign Application Priority Data

Aug. 19, 2019    (CN) .......................... 201910765288.4

(51) Int. Cl.
*G06K 9/00* (2006.01)
*G02F 1/1333* (2006.01)
*G02F 1/1335* (2006.01)
*G02F 1/1343* (2006.01)
*H01L 27/32* (2006.01)
(Continued)

(52) U.S. Cl.
CPC ....... *G06K 9/0004* (2013.01); *G02F 1/13338* (2013.01); *G02F 1/133512* (2013.01); *G02F 1/133514* (2013.01); *G02F 1/134309* (2013.01); *H01L 27/3227* (2013.01); *H01L 27/3232* (2013.01); *H01L 27/3234* (2013.01); *H01L 27/3246* (2013.01); *H01L 51/5253* (2013.01); *G02F 2201/121* (2013.01); *G02F 2201/123* (2013.01); *H01L 27/14678* (2013.01)

(58) Field of Classification Search
CPC .............. G06K 9/0004; H01L 27/3227; H01L 27/3232; G02F 1/13338; G02F 1/133617; G02F 2203/11; G02F 2001/13312
See application file for complete search history.

(56) References Cited

U.S. PATENT DOCUMENTS

| | | | |
|---|---|---|---|
| 2010/0007632 A1* | 1/2010 | Yamazaki | G06F 21/32 345/175 |
| 2020/0074139 A1* | 3/2020 | Zhou | H01L 27/3272 |
| 2020/0242324 A1* | 7/2020 | Li | G06K 9/00013 |

FOREIGN PATENT DOCUMENTS

| | | | | |
|---|---|---|---|---|
| CN | 108846392 A | | 11/2018 | |
| CN | 109950235 A | * | 6/2019 | ............. H01L 25/16 |

* cited by examiner

*Primary Examiner* — Jessica M Merlin
(74) *Attorney, Agent, or Firm* — Kilpatrick Townsend & Stockton, LLP

(57) ABSTRACT

Embodiments of the present disclosure provide a display device and relate to the display technology field. The display device includes: a first base substrate, a plurality of pixels arranged in an array, a light source, configured to emit visible light, at least one photoluminescence unit, configured to convert the visible light into invisible light, and at least one light sensing element, configured to perform fingerprint recognition according to the invisible light reflected by a touch body. The display device implements the fingerprint recognition with the invisible light, and then the influence on the fingerprint recognition caused by the visible light from the external environment or backlight source and irradiated onto the light sensing element is avoided, thereby improving a fingerprint recognition precision.

4 Claims, 11 Drawing Sheets

(51) Int. Cl.
*H01L 51/52* (2006.01)
*H01L 27/146* (2006.01)

DISPLAY DEVICE

CROSS-REFERENCES TO RELATED APPLICATIONS

This application claims priority to Chinese patent application No. CN201910765288.4 filed at CNIPA on Aug. 19, 2019, disclosure of which is incorporated herein by reference in its entirety.

FIELD

The present disclosure relates to the display technology field and, in particular, to a display device.

BACKGROUND

A fingerprint is inherent and unique for everybody. With the development of science and technology, various display devices having fingerprint recognition functions appear on the market. Such devices include mobile phones, tablet PCs, intelligent wearable equipment, etc. In this way, before operating a display device having the fingerprint recognition function, a user can perform rights verification by just touching, with his/her finger, a fingerprint recognition unit of the display device, thereby simplifying the rights verification process.

A fingerprint is composed of a series of ridges and valleys on a skin surface at a finger end. The light reflected by the ridges and received by the fingerprint recognition and the light reflected by the valleys and received by the fingerprint recognition unit are different in intensity, so the current/voltage signal converted from the light reflected by the ridges and the current/voltage signal converted from the light reflected by the ridges valleys are different in magnitude, and thus the fingerprint recognition can be performed according to the magnitude of the current/voltage signal.

However, a light sensing element for fingerprint recognition may be irradiated by visible light from external environment or a backlight source, which will affect the fingerprint recognition.

SUMMARY

The present disclosure provides a display device, which implements fingerprint recognition by utilizing invisible light, such that the influence on the fingerprint recognition caused by visible light from external environment or a backlight source and irradiated onto a light sensing element is avoided, thereby improving a fingerprint recognition precision.

Embodiments of the present disclosure provide a display device. The display device includes: a first base substrate, a plurality of pixels arranged in an array, a light source, at least one photoluminescence unit and at least one light sensing element.

The light source is configured to emit visible light.

The at least one photoluminescence unit is configured to convert the visible light emitted by the light source into invisible light.

The at least one light sensing element is configured to perform fingerprint recognition according to the invisible light reflected by a touch body.

In the embodiments of the present disclosure, the display device includes the photoluminescence unit and the light sensing element, the photoluminescence unit may convert the visible light emitted by the light source into the invisible light, the invisible light is irradiated onto the touch body and then reflected by the touch body, and the reflected light is received by the light sensing element to implement the fingerprint recognition. In the embodiments of the present disclosure, the invisible light is utilized to implement the fingerprint recognition and the influence on the fingerprint recognition since the visible light from the external environment or the backlight source may be irradiated onto the light sensing element is avoided, thereby improving the fingerprint recognition precision.

DETAILED DESCRIPTION

Figure 1:
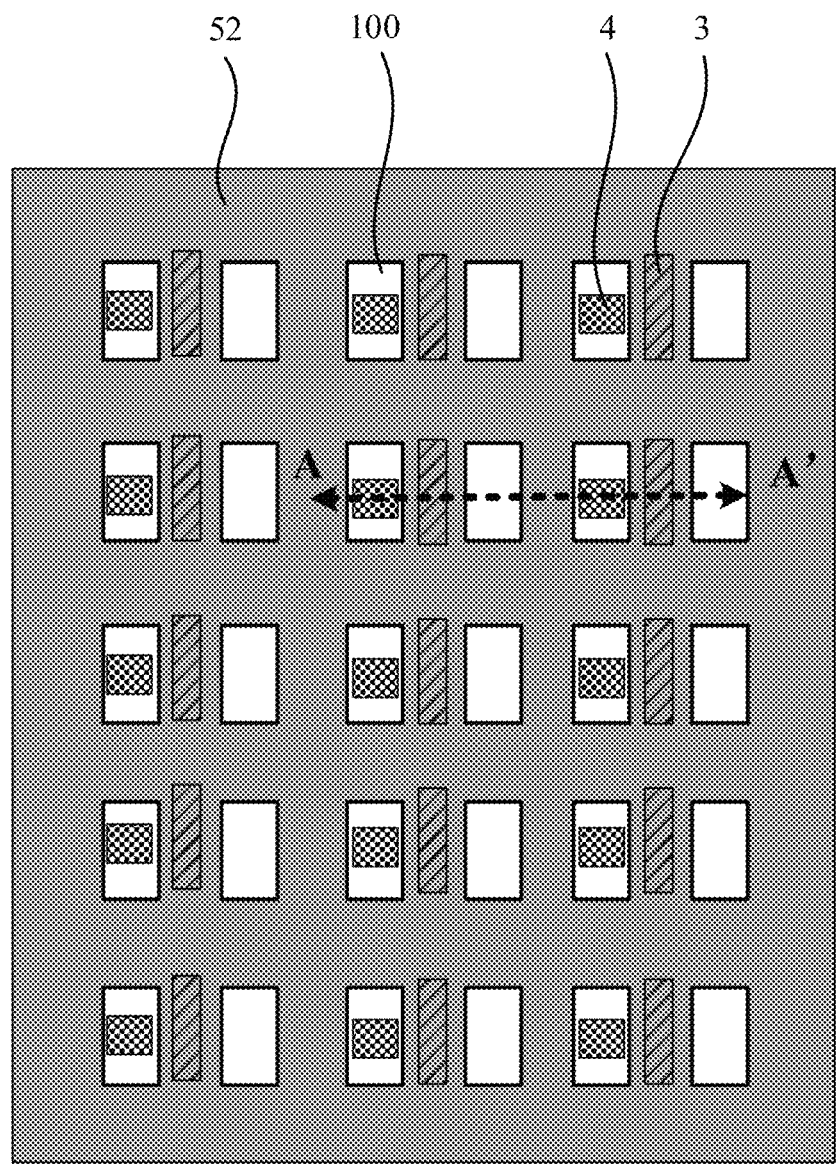
FIG. 1 is a top view of a display device according to an embodiment of the present disclosure.

Hereinafter the present disclosure will be further described in detail in conjunction with the drawings and embodiments. It is to be understood that the embodiments set forth below are intended to illustrate and not to limit the present disclosure. Additionally, it is to be noted that, for ease of description, only part, not all, of the structures related to the present disclosure are illustrated in the drawings.

Figure 2:
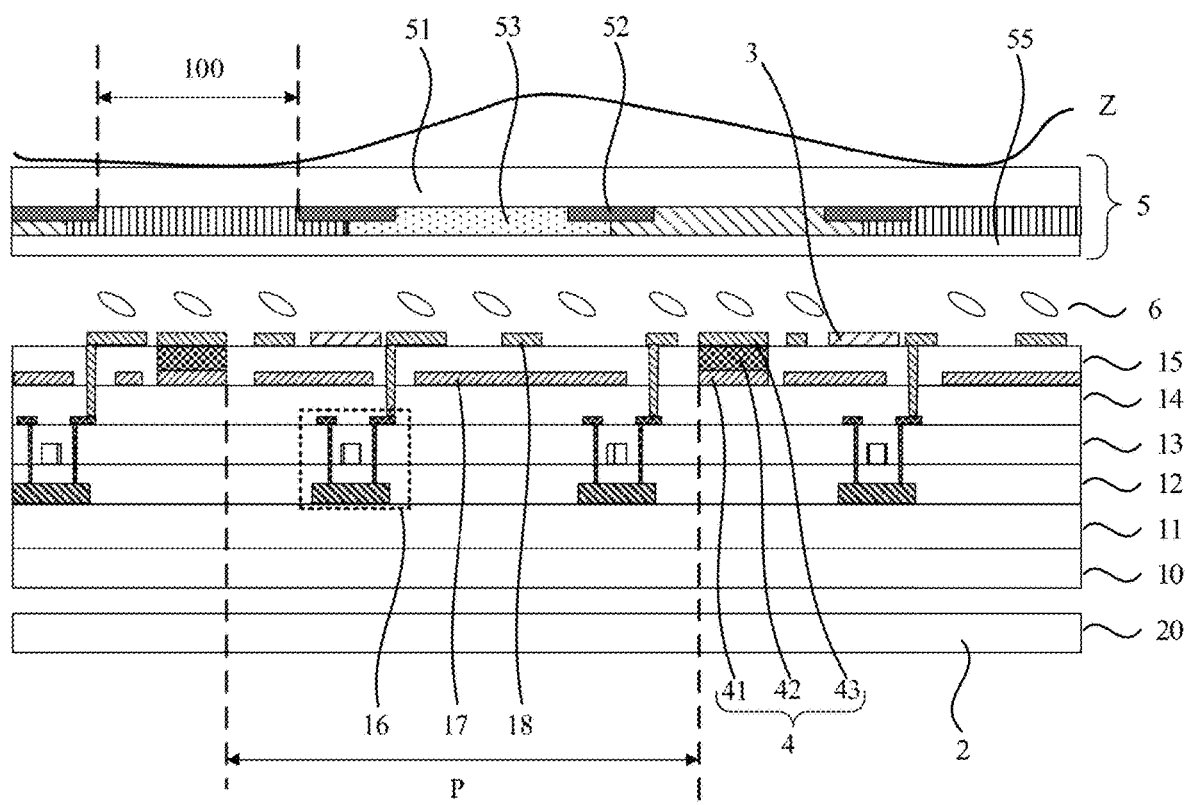
FIG. 2 is a sectional view taken along a line AA' in FIG. 1.

FIG. 1 is a top view of a display device according to an embodiment of the present disclosure. FIG. 2 is a sectional view of the display device taken along a line AA' in FIG. 1. Referring to FIG. 1 and FIG. 2, the display device includes a first base substrate 10 and a plurality of pixels 100. The plurality of pixels 100 is disposed on a side of the first base substrate 10, and is arranged in an array. The display device further includes a light source 20, at least one photoluminescence unit 3 and at least one light sensing element 4. The light source 20 is configured to emit visible light. The at least one photoluminescence unit 3 converts the visible light emitted by the light source 20 into invisible light. The at least one light sensing element 4 is not sensitive to visible light, that is, the at least one light sensing element 4 does not respond to the visible light irradiated thereon. The at least one light sensing element 4 performs fingerprint recognition according to the invisible light reflected by a touch body Z. The display device is not limited in the present disclosure. In one embodiment, the display device may be a liquid crystal display device, an organic light emitting display device, or the like.

In the embodiment of the present disclosure, the display device includes the photoluminescence unit and the light sensing element, the photoluminescence unit may convert the visible light emitted by the light source into the invisible light (the invisible light is light other than the visible light in natural light, and may include, for example, infrared light and ultraviolet light), the invisible light is irradiated onto the touch body (for example, a finger) and then reflected by the touch body, and then the reflected light is received by the light sensing element to implement the fingerprint recognition. In the embodiment of the present disclosure, the invisible light is utilized to implement the fingerprint recognition, and influence on the fingerprint recognition since visible light from external environment or a backlight source may be irradiated onto the light sensing element is avoided, thereby improving a fingerprint recognition precision.

It is to be noted that in the embodiment of the present disclosure, the photoluminescence unit is irradiated by visible light emitted by the light source and generates invisible light. The light source emitting the visible light is used for display of the display device, and also is configured to cause the photoluminescence unit to generate the invisible light, so that it is not necessary to additionally dispose a dedicated light source for emitting the invisible light, reducing costs of the display device. In addition, the visible light emitted by the light source in the embodiment of the disclosure is directly irradiated onto the photoluminescence unit and causes the photoluminescence unit to emit the invisible light, so the visible light received by the photoluminescence unit has a higher intensity, which is beneficial to excitation of the invisible light. In order to avoid signal interference, in the embodiment of the present disclosure, the photoluminescence unit 3 and the light sensing element 4 are also arranged in a staggered manner, that is, a vertical projection of the photoluminescence unit 3 on the first base substrate 10 does not overlap a vertical projection of the light sensing element 4 on the first base substrate 10.

In one embodiment, referring to FIG. 1 and FIG. 2, the photoluminescence unit 3 converts the visible light into infrared light. In the embodiment of the present disclosure, the photoluminescence unit 3 converts the visible light into the infrared light, and the transmittance of the infrared light in the display device is high and does no harm to human bodies.

In one embodiment, referring to FIG. 1 and FIG. 2, the display device further includes an counter substrate 5, a liquid crystal layer 6 and a backlight module 2. The counter substrate 5 includes a second base substrate 51. The liquid crystal layer 6 is disposed between the first base substrate 10 and the second base substrate 51. The backlight module 2 is disposed on a side of the first base substrate 10 facing away from the counter substrate 5 and includes the light source 20. The display device in the embodiment of the disclosure is the liquid crystal display device. The visible light emitted by the backlight module 2 is irradiated onto liquid crystal molecules in the liquid crystal layer 6, and transmittances of liquid crystal molecules in different pixels 100 are controlled by controlling deflection angles of the liquid crystal molecules in the different pixels 100, so as to implement an image display. On the other hand, the visible light emitted by the backlight module 2 is irradiated onto the photoluminescence unit 3 to cause the photoluminescence unit 3 to emit the invisible light, which may be reflected by the touch body Z to implement the fingerprint recognition.

In one embodiment, referring to FIG. 1 and FIG. 2, the counter substrate 5 further includes a black matrix 52 disposed on a side of the second base substrate 51 facing towards the liquid crystal layer 6. A vertical projection of the photoluminescence unit 3 on a plane where the second base substrate 51 is located is within a vertical projection of the black matrix 52 on the plane where the second base substrate 51 is located. In the embodiment of the present disclosure, the vertical projection of the photoluminescence unit 3 on the plane where the second base substrate 51 is located is within the vertical projection of the black matrix 52 on the plane where the second base substrate 51 is located, and the photoluminescence unit 3 is disposed below the black matrix 52, that is, the photoluminescence unit 3 is disposed in a non-opening region other than the pixels 100, and the photoluminescence unit 3 does not affect luminance and chroma of the pixel 100 and does not affect the light emitting and display of the display device.

Exemplarily, referring to FIG. 1 and FIG. 2, the vertical projection of the photoluminescence unit 3 on the plane where the second base substrate 51 is located is within the vertical projection of the black matrix 52 on the plane where the second base substrate 51 is located, the photoluminescence unit 3 is disposed below the black matrix 52, and the light sensing element 4 is disposed within the pixel 100. In other embodiments, both the vertical projection of the photoluminescence unit 3 and a vertical projection of the light sensing element 4 on the plane where the second base substrate 51 are located within the vertical projection of the black matrix 52 on the plane where the second base substrate 51 is located.

The black matrix 52 can block the visible light and transmit at least a part of the infrared light (infrared light with a wavelength between 770 nm and 1 mm). That is, the black matrix 52 may also absorb a part of the infrared light. In one embodiment, in order to improve transmittance of the black matrix 52 for the infrared light, the black matrix 52 may be made of a material having an optical density less than 2. In one embodiment, the black matrix 52 may be made of a material having an optical density less than 1.2, to further improve the transmittance of the black matrix 52 for the infrared light. In the embodiment of the present disclosure, the black matrix 52 made of the material whose optical density is less than 2 has higher transmittance for light whose wavelength is greater than 650 nm. The optical density is used for measuring an ability of a refractive index medium or an optical element to slow or delay a light transmission.

Figure 3:
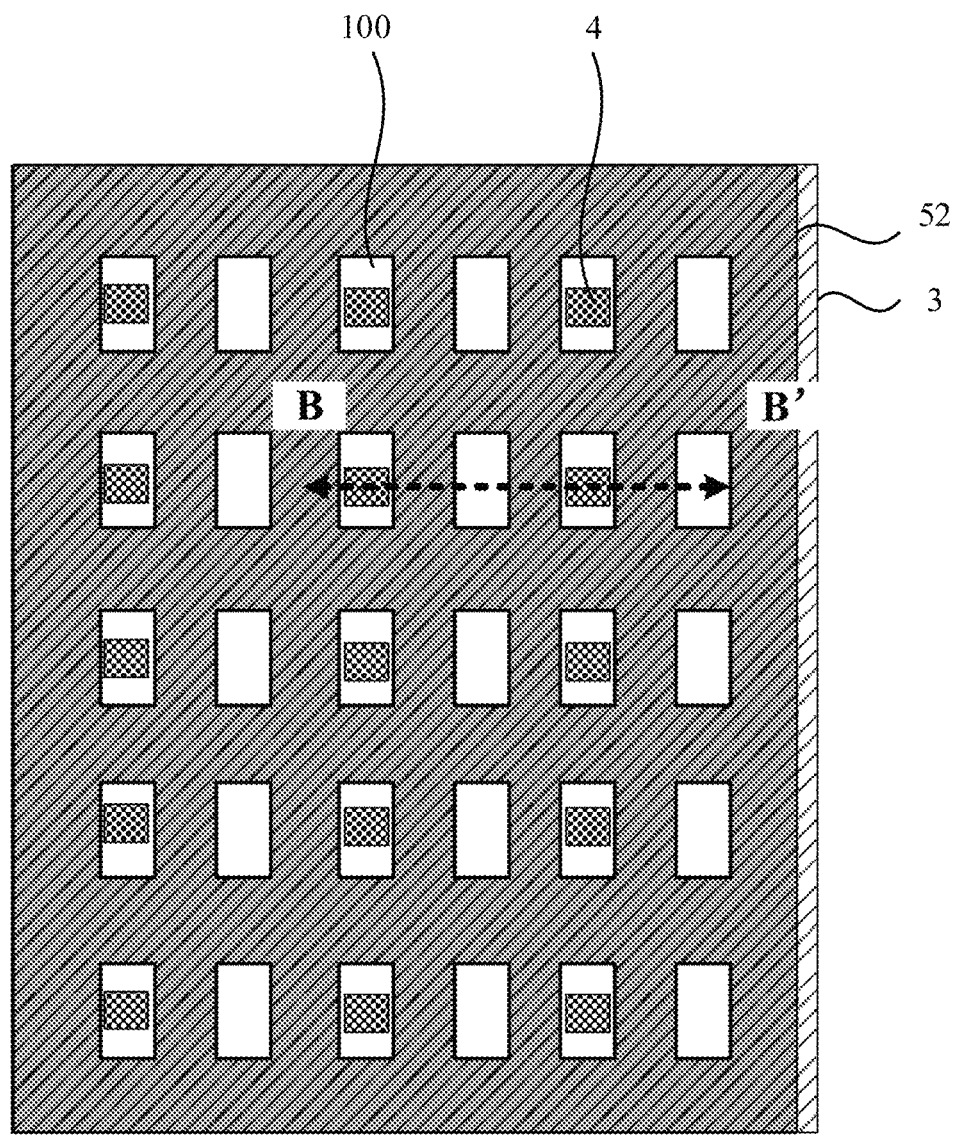
FIG. 3 is a top view of another display device according to an embodiment of the present disclosure.
Figure 4:
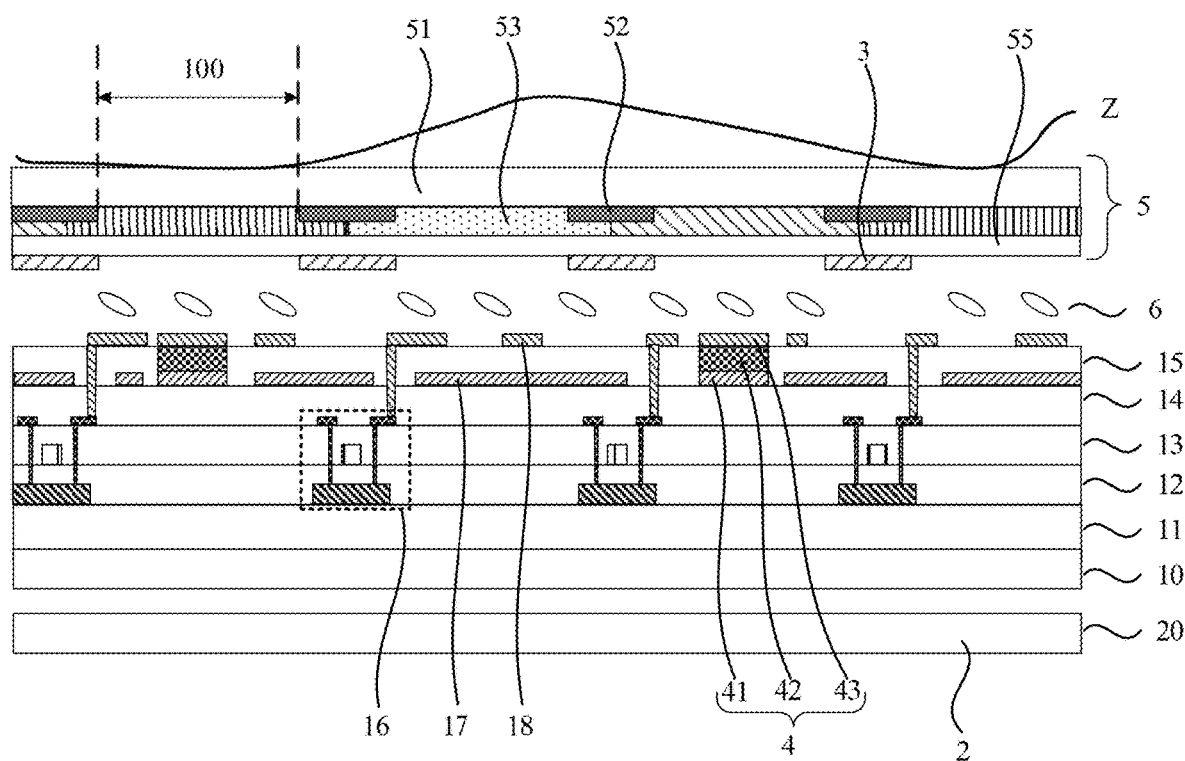
FIG. 4 is a sectional view taken along a line BB' in FIG. 3.

FIG. 3 is a top view of another display device according to an embodiment of the present disclosure. FIG. 4 is a sectional view of display device taken along a line BB' in FIG. 3. Referring to FIG. 3 and FIG. 4, the vertical projection of the photoluminescence unit 3 on the plane where the second base substrate 51 is located coincides with the vertical projection of the black matrix 52 on the plane where the second base substrate 51 is located. It is to be noted that since the black matrix 52 completely shields the photoluminescence unit 3 in the top view, for convenience of marking and illustration, the edge of the black matrix 52 and the edge of the photoluminescence unit 3 are staggered to some extent in FIG. 3, while in practice, the black matrix 52 completely overlaps with the photoluminescence unit 3 in the top view. In the embodiment of the present disclosure, the photoluminescence unit 3 and the black matrix 52 have a same shape, so that on the basis of ensuring that the photoluminescence unit 3 does not affect the light emitting display of the display device, an area of the photoluminescence unit 3 is increased to a maximum extent, and the irradiation region of the invisible light is increased, so as to implement the fingerprint recognition in any region of the display device. Since the photoluminescence unit 3 and the black matrix 52 have the same shape, the vertical projection of the photoluminescence unit 3 on the plane where the second base substrate 51 is located has a same area as the vertical projection of the black matrix 52 on the plane where the second base substrate 51 is located, and the photoluminescence unit 3 and the black matrix 52 may be formed by using a same mask. In this way, it is unnecessary to employ different masks to form the photoluminescence unit 3 and the black matrix 52, thereby reducing process difficulty of the display device.

Exemplarily, referring to FIG. 3 and FIG. 4, the vertical projection of the photoluminescence unit 3 on the plane where the second base substrate 51 is located coincides with the vertical projection of the black matrix 52 on the plane where the second base substrate 51 is located, and the light sensing element 4 is disposed within the pixel 100. The counter substrate 5 further includes a planarization layer 55, which is disposed between the second base substrate 51 and the liquid crystal layer 6. The photoluminescence unit 3 is disposed between the planarization layer 55 and the liquid crystal layer 6. In other embodiments, the photoluminescence unit 3 may be disposed between the planarization layer 55 and the second base substrate 51.

In one embodiment, referring to FIG. 1 and FIG. 2, the counter substrate 5 further includes a plurality of color resists 53. The plurality of color resists 53 is disposed between the black matrix 52 and the liquid crystal layer 6, and each of the plurality of color resists 53 is disposed between two adjacent black matrices 52. The vertical projection of the light sensing element 4 on the plane where the second base substrate 51 is located overlaps a vertical projection of a portion of the color resist 53 within the pixel 100 on the plane where the second base substrate 51 is located. The light sensing element 4 includes a first electrode 41, a photosensitive layer 42 and a second electrode 43. The photosensitive layer 42 is disposed on a side of the first electrode 41 facing towards the second base substrate 51. The second electrode 43 is disposed on a side of the photosensitive layer 42 facing towards the second base substrate 51. The photosensitive layer 42 is disposed between the first electrode 41 and the second electrode 43. The first electrode 41 and the second electrode 43 are transparent electrodes. In the embodiment of the present disclosure, the light sensing element 4 is at least partially disposed within the pixel 100, so that more space may be reserved for the photoluminescence unit 3 in a region where the black matrix 52 is located, thereby increasing an area of the photoluminescence unit 3 and an area of an emitting region of the infrared light in the display device. The first electrode 41 and the second electrode 43 of the light sensing element 4 are transparent electrodes, so that the light sensing element 4 has good transmittance for visible light, and influence of the light sensing element 4 on the display function of the display device is reduced. It is to be noted that a structure of the light sensing element 4 is not specifically limited in the present disclosure. When the light sensing element 4 is disposed within the pixel 100, in order not to affect the display function of the display device, the first electrode 41 and the second electrode 43 may be configured to be transparent electrodes. When the light sensing element 4 is disposed in the non-opening region other than the pixels 100, the first electrode 41 of the light sensing element 4 may be the transparent electrode, or the first electrode 41 may further include a metal material non-transmissive to visible light.

In one embodiment, referring to FIG. 1 and FIG. 2, both the light sensing element 4 and the photoluminescence unit 3 are disposed between the first base substrate 10 and the counter substrate 5. A vertical distance between the first electrode 41 and the first base substrate 10 is less than or equal to a vertical distance between the photoluminescence unit 3 and the first base substrate 10. That is, the photoluminescence unit 3 is closer to the touch body Z than the light sensing element 4, or the photoluminescence unit 3 is disposed at a same layer as the first electrode 41 of the light sensing element 4. In the embodiment of the present disclosure, the vertical distance between the first electrode 41 and the first base substrate 10 is less than or equal to the vertical distance between the photoluminescence unit 3 and the first base substrate 10, so that the invisible light generated by the photoluminescence unit 3 when being excited is prevented from being irradiated onto the photosensitive layer 42 directly through the first electrode 41. In this way, the invisible light received by the light sensing element 4 only includes the invisible light which is reflected by the touch body Z, carries fingerprint information and is irradiated onto the photosensitive layer 42 through the second electrode 43, thereby improving the fingerprint recognition precision.

In one embodiment, referring to FIG. 1 and FIG. 2, the display device includes a plurality of light sensing elements 4, where a distance P between two adjacent light sensing elements 4 satisfies 300 μm≤P≤500 μm. The distance between two adjacent light sensing elements 4 is a distance between adjacent edges of the two adjacent light sensing elements 4. The distance between two adjacent light sensing elements 4 may include a row-direction distance between the two adjacent light sensing elements 4, and may also include a column-direction distance between the two adjacent light sensing elements 4. Because a ridge-valley cycle of the fingerprint is 300 μm to 500 μm, at least one light sensing element 4 is used for the fingerprint recognition in one ridge-valley cycle, ensuring that the display device has a sufficient fingerprint recognition precision.

In one embodiment, referring to FIG. 1 and FIG. 2, a vertical projection of each photoluminescence unit 3 on a plane where the first base substrate 10 is located has an area greater than or equal to 1500 μm$^2$, and a vertical projection of each light sensing element 4 on the plane where the first base substrate 10 is located has an area greater than or equal to 200 μm$^2$, so as to ensure that each photoluminescence unit 3 generates the invisible light having a sufficient intensity, and that the invisible light reflected by the touch body Z and received by the light sensing element 4 has a sufficient intensity.

In one embodiment, referring to FIG. 2, the display device further includes a common electrode 17 and a pixel electrode 18. The common electrode 17 and the pixel electrode 18 are disposed between the first base substrate 10 and the liquid crystal layer 6. The pixel electrode 18 is disposed between the common electrode 17 and the liquid crystal layer 6. The first electrode 41 and the common electrode 17 are arranged at a same layer and made of a same material. The second electrode 43 and the pixel electrode 18 are arranged at a same layer and made of a same material. The common electrode 17 and the pixel electrode 18 may be transparent electrodes. The common electrode 17 and the pixel electrodes 18 within different pixels 100 are controlled to generate different electric field intensities to control deflection angles of the liquid crystal molecules in the liquid crystal layer, so as to control the transmittance of the liquid crystal molecules in the different pixels 100 and implement the image display. In the embodiment of the present disclosure, the first electrode 41 and the common electrode 17 are arranged at the same layer and made of the same material, so that the first electrode 41 and the common electrode 17 may be made of the same material and formed in a same process, thereby simplifying the process. The second electrode 43 and the pixel electrode 18 are arranged at the same layer and made of the same material, so that the second electrode 43 and the pixel electrode 18 may be made of the same material and formed in a same process, thereby simplifying the process. In other embodiments, only the first electrode 41 and the common electrode 17 may be arranged at the same layer and made of the same material, or only the second electrode 43 and the pixel electrode 18 may be arranged at the same layer and made of the same material, which is not limited in the present disclosure.

Exemplarily, referring to FIG. 2, the display device may further include a buffer layer 11, a gate insulating layer 12, an interlayer insulating layer 13, an array planarization layer 14, a passivation layer 15 and a pixel drive circuit 16, which are disposed on a side of first base substrate 10. The pixel drive circuit 16 is electrically connected to the pixel electrode 18 and is configured to supply a drive voltage or a drive current to the pixel electrode 18. The pixel drive circuit 16 includes a thin film transistor, where the thin film transistor includes a gate, a source, a drain and a semiconductor layer. The source or the drain of the thin film transistor is electrically connected to the pixel electrode 18. The passivation layer 15 is disposed between the common electrode 17 and the pixel electrode 18 for electrically insulating the common electrode 17 from the pixel electrode 18. The first electrode 41 and the common electrode 17 are arranged at the same layer, and the second electrode 43 and the pixel electrode 18 are arranged at the same layer.

Figure 5:
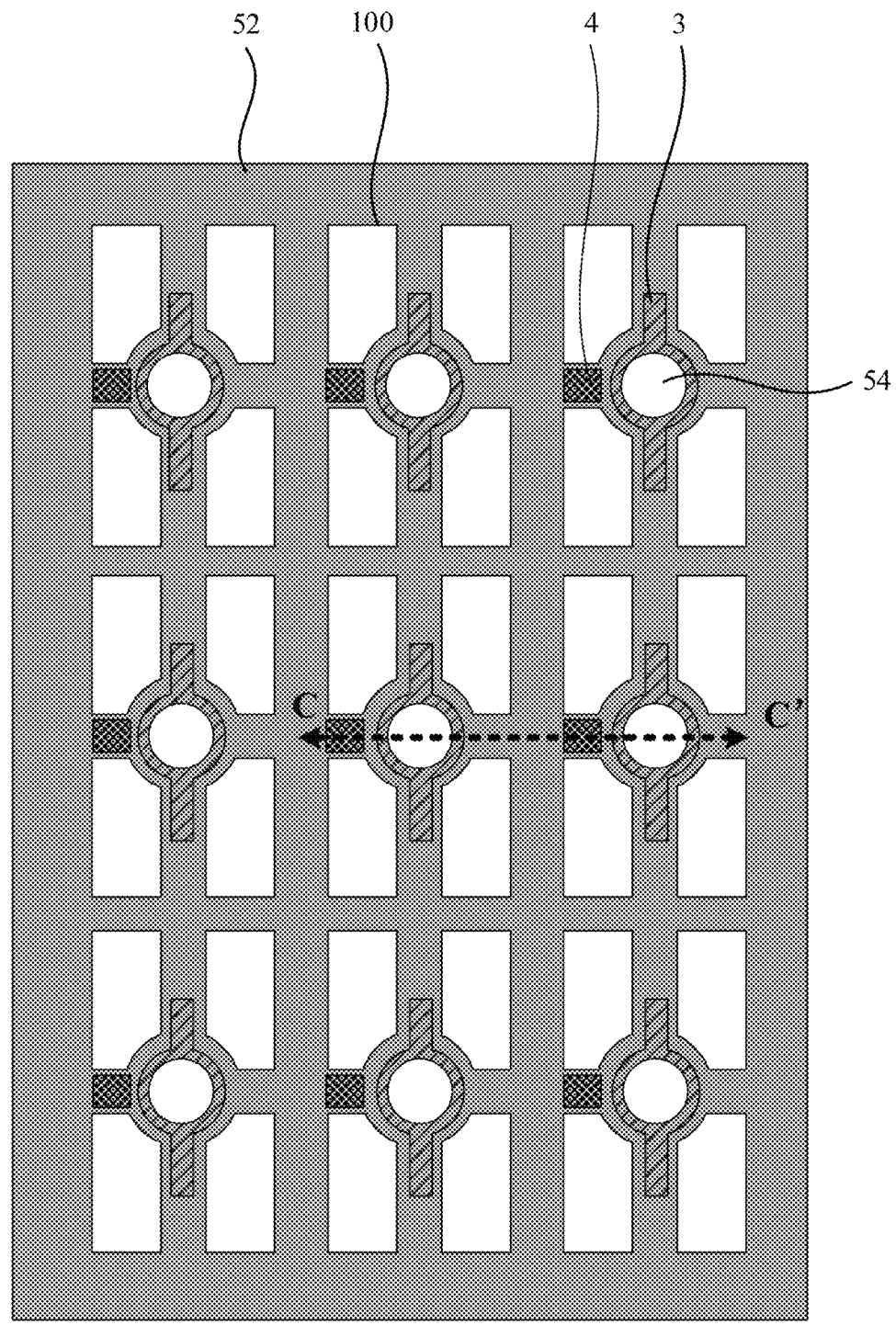
FIG. 5 is a top view of another display device according to an embodiment of the present disclosure.
Figure 6:
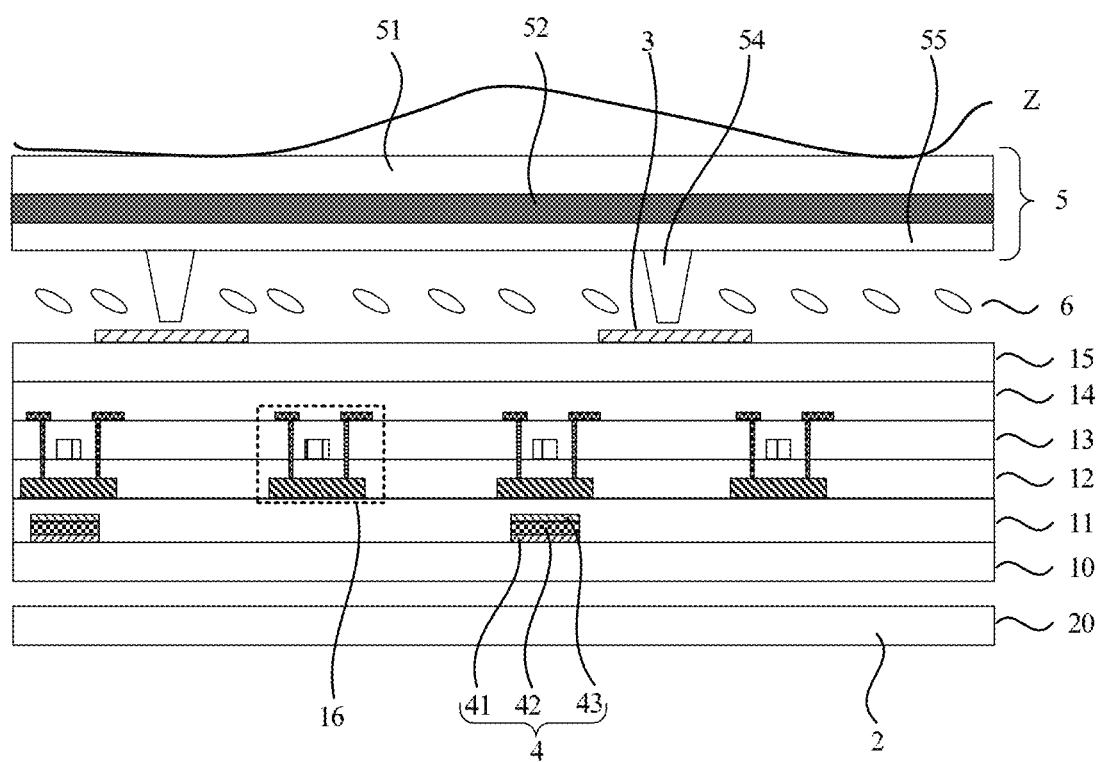
FIG. 6 is a sectional view taken along a line CC' in FIG. 5.

FIG. 5 is a top view of another display device according to an embodiment of the present disclosure and FIG. 6 is a sectional view of the display device taken along a line CC' in FIG. 5. Referring to FIG. 5 and FIG. 6, the vertical projection of the photoluminescence unit 3 on the plane where the second base substrate 51 is located is within the vertical projection of the black matrix 52 on the plane where the second base substrate 51 is located, and the vertical projection of the light sensing element 4 on the plane where the second base substrate 51 is located is within the vertical projection of the black matrix 52 on the plane where the second base substrate 51 is located. In the embodiment of the present disclosure, both the photoluminescence unit 3 and the light sensing element 4 are disposed in the non-opening region other than the pixels 100, and are disposed below the black matrix 52 and then the light emitting and display function of the display device will not be affected by the photoluminescence unit 3 and the light sensing element 4.

In one embodiment, referring to FIG. 5 and FIG. 6, the display device further includes the pixel drive circuit 16 disposed between the first base substrate 10 and the liquid crystal layer 6. A vertical projection of the pixel drive circuit 16 on the plane where the first base substrate 10 is located is within a vertical projection of the black matrix 52 on the plane where the first base substrate 10 is located. The light sensing element 4 is disposed between the first base substrate 10 and a film where the pixel drive circuit 16 is located. The film where the pixel drive circuit 16 is located includes films where the gate, the source, the drain and the semiconductor layer of the thin film transistor in the pixel drive circuit 16 are located. The pixel drive circuit 16 needs to be electrically connected to the pixel electrode 18 through a via. If the light sensing element 4 is disposed between the pixel drive circuit 16 and the pixel electrode 18, the via will penetrate through the light sensing element 4 and affect a sensing capability of the light sensing element 4. In the embodiment of the present disclosure, the light sensing element 4 is disposed between the first base substrate 10 and the film where the pixel drive circuit 16 is located, and then the via will not penetrate through the light sensing element 4. On the other hand, the light sensing element 4 is disposed between the first base substrate 10 and the film where the pixel drive circuit 16 is located, and the light sensing element 4 is formed before the pixel drive circuit 16, the common electrode 17 and the pixel electrode 18, and then manufacturing processes of the pixel drive circuit 16, the common electrode 17 and the pixel electrode 18 will not be affected.

Exemplarily, referring to FIG. 6, the light sensing element 4 is disposed between the first base substrate 10 and the buffer layer 11. In other embodiments, the light sensing element 4 may also be disposed between the pixel drive circuit 16 and the buffer layer 11. The vertical projection of the light sensing element 4 on the first base substrate 10 is within the vertical projection of the black matrix 52 on the first base substrate 10. The light sensing element 4 is disposed between the first base substrate 10 and the pixel drive circuit 16. The vertical projection of the light sensing element 4 on the first base substrate 10 overlaps the vertical projection of the pixel drive circuit 16 on the first base substrate 10. Since the opaque metal (e.g., the source or the drain) in the pixel drive circuit 16 is relatively small and narrow, fewer invisible light may be blocked by the pixel drive circuit 16, and most of the invisible light reflected by the touch body can reach the light sensing element 4. In other embodiments, the vertical projection of the light sensing element 4 on the first base substrate 10 may not overlap the vertical projection of the pixel drive circuit 16 on the first base substrate 10, and the light sensing element 4 is disposed in a region without the pixel drive circuit 16.

In one embodiment, referring to FIG. 2 and FIG. 6, both the photoluminescence unit 3 and the light sensing element 4 are disposed between the first base substrate 10 and the liquid crystal layer 6. Referring to FIG. 4, the photoluminescence unit 3 is disposed between the second base substrate 51 and the liquid crystal layer 6, and the light sensing element 4 is disposed between the first base substrate 10 and the liquid crystal layer 6. In other embodiments, the photoluminescence unit 3 and the light sensing element 4 both are disposed between the second base substrate 51 and the liquid crystal layer 6. In other embodiments, the photoluminescence unit 3 may be disposed between the first base substrate 10 and the liquid crystal layer 6, and the light sensing element 4 may be disposed between the second base substrate 51 and the liquid crystal layer 6. In other embodiments, at least one of the photoluminescence unit 3 and the light sensing element 4 may be disposed on a side of the first base substrate 10 facing away from the second base substrate 51. The locations of the photoluminescence unit 3 and the light sensing element 4 are not limited in the present disclosure.

Figure 7:
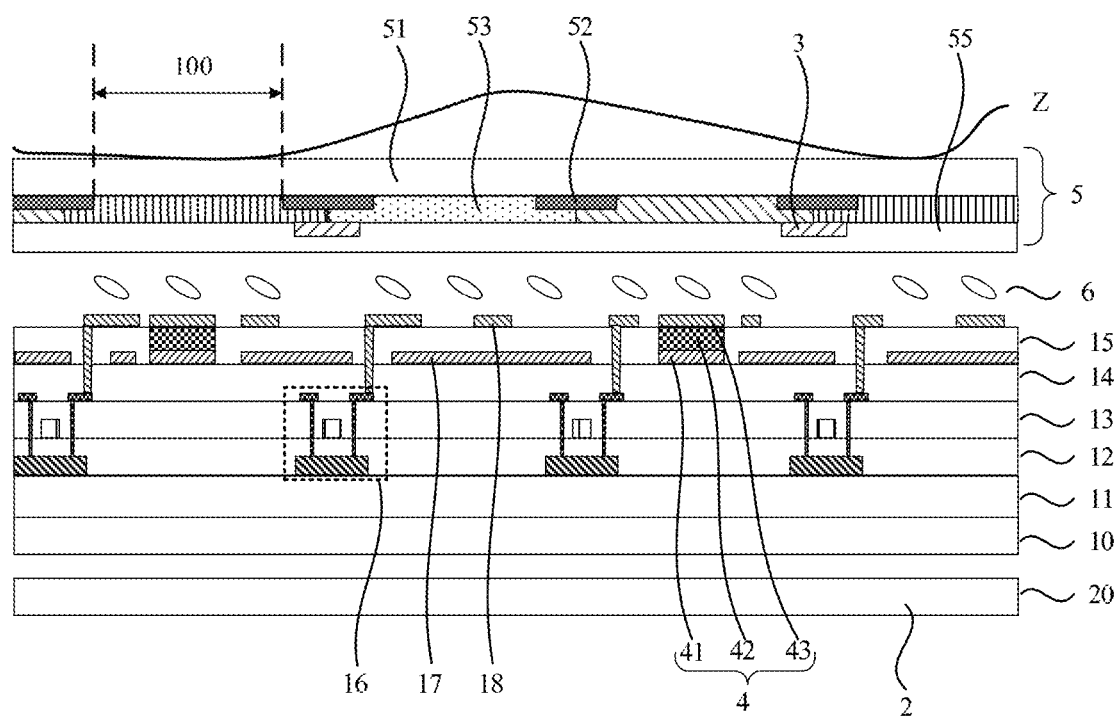
FIG. 7 is a sectional view of another display device according to an embodiment of the present disclosure.

FIG. 7 is a sectional view of another display device according to an embodiment of the present disclosure. Different from FIG. 2 in which the photoluminescence unit 3 is disposed between the first base substrate 10 and the liquid crystal layer 6, the photoluminescence unit 3 in FIG. 7 is disposed between the second base substrate 51 and the liquid crystal layer 6. Based on this, some exemplary positions of the photoluminescence unit 3 are further given.

Referring to FIG. 7, the counter substrate 5 further includes the planarization layer 55, where the planarization layer 55 is disposed between the second base substrate 51 and the liquid crystal layer 6. The photoluminescence unit 3 is disposed between the second base substrate 51 and the planarization layer 55. In the embodiment of the present disclosure, the photoluminescence unit 3 is disposed between the second base substrate 51 and the planarization layer 55, and the planarization layer 55 covers the photoluminescence unit 3, and then the alignment of the liquid crystal molecules in the liquid crystal layer 6 is not affected by of the photoluminescence unit 3, thereby ensuring a good alignment of the liquid crystal molecules in the liquid crystal layer 6.

Exemplarily, referring to FIG. 7, the photoluminescence unit 3 is disposed between the color resists 53 and the planarization layer 55. After the black matrix 52 and the color resists 53 are formed on the second base substrate 51, the photoluminescence unit 3 is formed on the color resists 53 at a position corresponding to the black matrix 52, and then the planarization layer 55 is formed on the photoluminescence unit 3 and the color resists 53. In other embodiments, the photoluminescence unit 3 may be disposed between the black matrix 52 and the color resists 53. After the black matrix 52 is formed on the second base substrate 51, the photoluminescence element 3 is formed on the black matrix 52, and the planarization layer 55 is formed on the photoluminescence element 3 and the color resists 53.

In one embodiment, referring to FIG. 5 and FIG. 6, positions of spacers and the number of spacers are only examples for convenience of explanation and description and are not intended to limit the present disclosure, and the positions of the spacers and the number of spacers may be determined according to a practical product. The display device further includes a spacer 54 between the first base substrate 10 and the second base substrate 51. The spacer 54 is configured to maintain a cell thickness between the first base substrate 10 and the second base substrate 51. The vertical projection of the photoluminescence unit 3 on the plane where the first base substrate 10 is located at least partially overlaps a vertical projection of the spacer 54 on the plane where the first base substrate 10 is located. The spacer 54 can maintain a thickness of a liquid crystal cell of the display device. In order to prevent the spacer 54 from being deformed or displaced when the display device is crushed by an external force, an area of a portion of the black matrix 52 corresponding to the spacer 54 is increased, thereby avoiding light leakage due to crushes. When the vertical projection of the photoluminescence unit 3 on the plane where the first base substrate 10 is located at least partially overlaps the vertical projection of the spacer 54 on the plane where the first base substrate 10, the area of the photoluminescence unit 3 and the area of the emitting region of the infrared light in the display device may be increased because of the increased area of the black matrix 52 at the position corresponding to the spacer 54. In other embodiments, only the vertical projection of the light sensing elements 4 on the plane where the first base substrate 10 is located at least partially overlaps the vertical projection of the spacer on the plane where the first base substrate is located. In one embodiment, the vertical projection of the photoluminescence unit 3 on the plane where the first base substrate 10 is located at least partially overlaps the vertical projection of the spacer 54 on the plane where the first base substrate 10 is located, and the vertical projection of the light sensing element 4 on the plane where the first base substrate 10 is located at least partially overlaps the vertical projection of the spacer 54 on the plane where the first base substrate 10 is located.

Exemplarily, referring to FIG. 5 and FIG. 6, a vertical projection of the spacer 54 on the plane where the second base substrate 51 is located is within the vertical projection of the black matrix 52 on the plane where the second base substrate 51 is located. The spacer 54 is disposed on a side of the planarization layer 55 facing away from the second base substrate 51.

Figure 8:
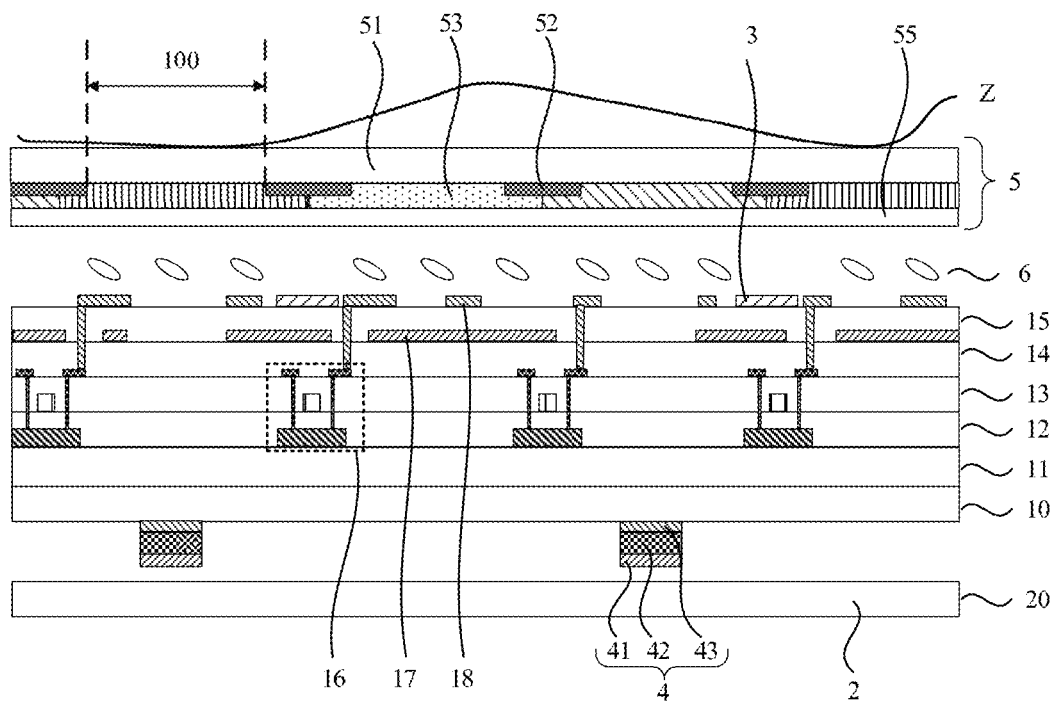
FIG. 8 is a sectional view of another display device according to an embodiment of the present disclosure.

FIG. 8 is a sectional view of another display device according to an embodiment of the present disclosure. Different from FIG. 2 in which the photoluminescence unit 3 and the light sensing element 4 are both disposed between the first base substrate board 10 and the second base substrate board 51, FIG. 7 illustrates that the light sensing element 4 is disposed on the side of the first base substrate 10 facing away from the second base substrate 51. Referring to FIG. 7, the photoluminescence unit 3 is disposed between the first base substrate 10 and the second base substrate 51, and the light sensing element 4 is disposed on the side of the first base substrate 10 facing away from the second base substrate 51. The light sensing element 4 does not affect a structure of the display device and an original manufacturing process of the display device. In other embodiments, the photoluminescence unit 3 may also be disposed on the side of the first base substrate 10 facing away from the second base substrate 51, which is not limited in the present disclosure.

Figure 9:
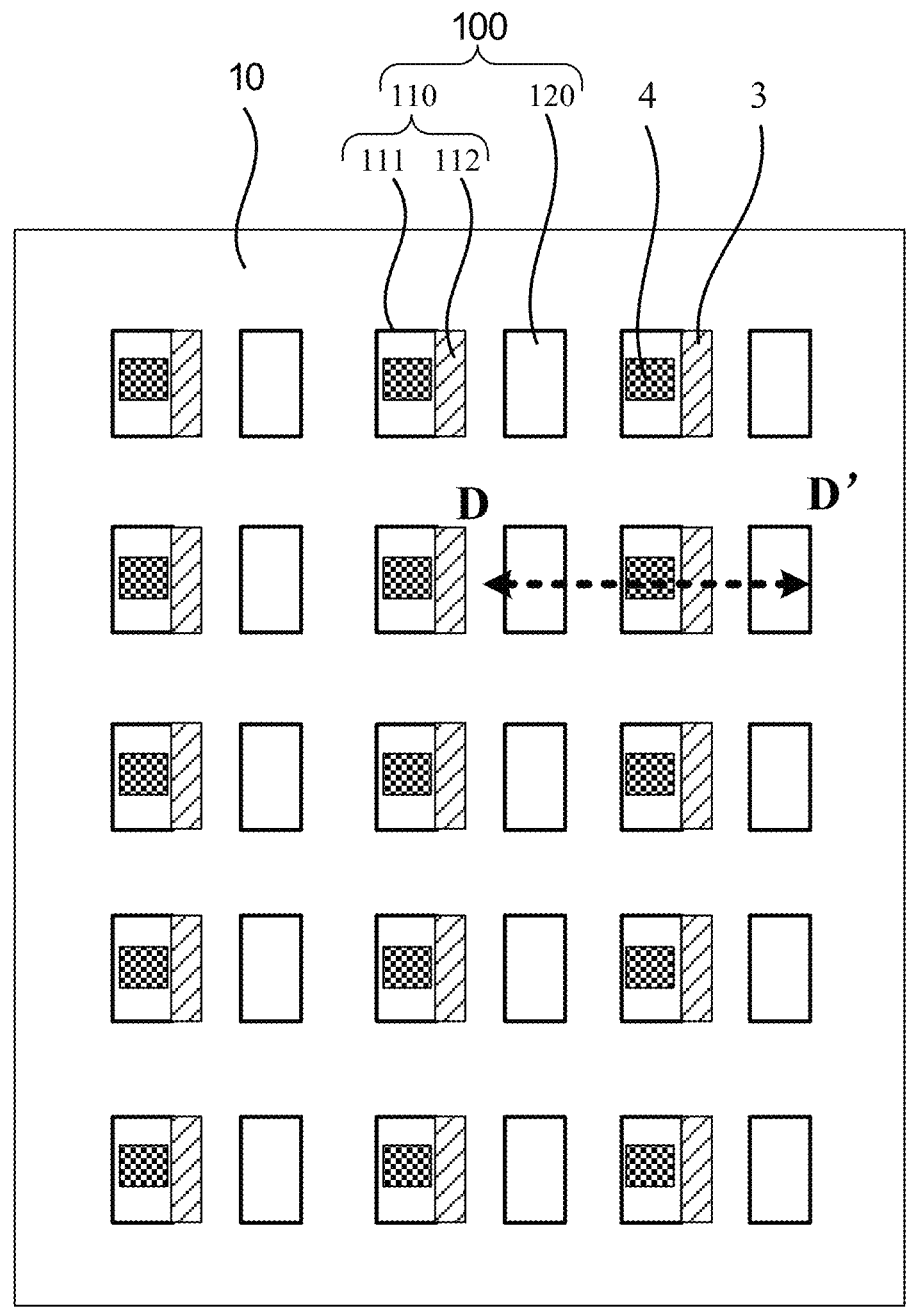
FIG. 9 is a top view of another display device according to an embodiment of the present disclosure.
Figure 10:
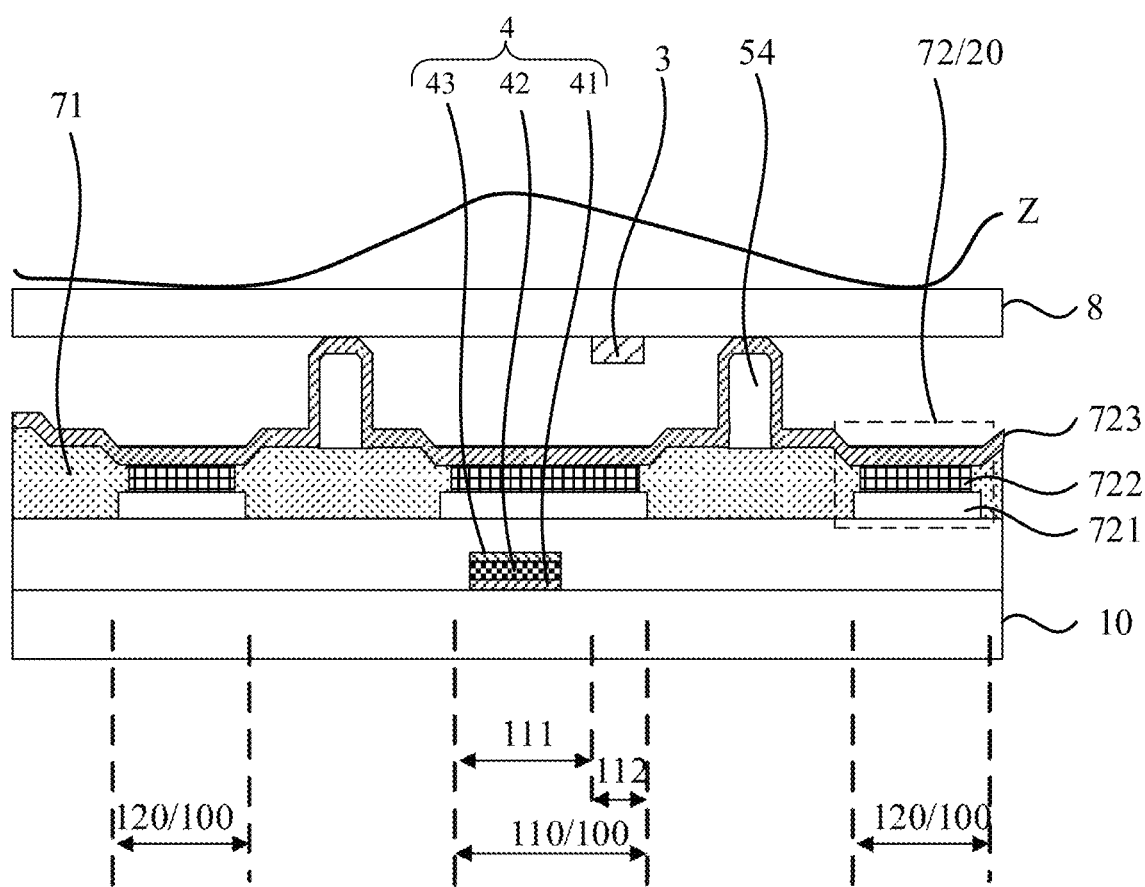
FIG. 10 is a sectional view taken along a line DD' in FIG. 9.

FIG. 9 is a top view of another display device according to an embodiment of the present disclosure. FIG. 10 is a sectional view of the display device taken along a line DD' in FIG. 9. Referring to FIG. 9 and FIG. 10, in order to illustrate the relationship of the pixels 100, the photoluminescence unit 3 and the light sensing element 4, the spacer 54 and the like are not illustrated in FIG. 9. The display device further includes a pixel definition layer 71 disposed on one side of the first base substrate 10 and a plurality of organic light emitting units 72 disposed in openings of the pixel definition layer 71. The plurality of organic light emitting units 72 is reused as the light source 20. In the embodiment of the present disclosure, the display device is the organic light emitting display device, the plurality of organic light emitting units 72 is controlled to emit light in different luminance, so as to implement the image display. On the other hand, the visible light emitted by the plurality of organic light emitting units 72 is irradiated onto the photoluminescence unit 3 to cause the photoluminescence unit 3 to emit invisible light which may be reflected by the touch body Z to implement the fingerprint recognition.

In one embodiment, referring to FIG. 10, the display device further includes an encapsulation cover plate 8 on a side of the plurality of organic light emitting units 72 facing away from the first base substrate 10. The photoluminescence unit 3 is disposed on the encapsulation cover plate 8 and on a side of the encapsulation cover plate 8 facing towards the first base substrate 10. Since the photoluminescence unit 3 needs to convert the visible light emitted by the plurality of the organic light emitting units 72 into the invisible light, the photoluminescence unit 3 needs to be disposed in a light emitting direction of the organic light emitting units 72. Meanwhile, in order to protect the photoluminescence unit 3 from external damage, in the embodiment of the present disclosure, the photoluminescence unit 3 is disposed on the encapsulation cover plate 8 and on the side of the encapsulation cover plate 8 facing towards the first base substrate 10. In the embodiment of the present disclosure, the organic light emitting display device, for example, may be encapsulated by a cover plate. In other embodiments, the organic light emitting display device may also be encapsulated by a thin film.

Exemplarily, referring to FIG. 10, the encapsulation cover plate 8 and the first base substrate 10 are adhesively fixed together by a sealant (not shown in FIG. 11) at an edge of the display device, and then a closed space is formed. The organic light emitting unit 72 includes an anode 721, a light emitting function layer 722 and a cathode 723. The anode 721 is disposed between the first base substrate 10 and the light emitting function layer 722. The light emitting function layer is disposed between the anode 721 and the cathode 723. The light emitting function layer 722 includes a light emitting material layer and at least one of a hole injection layer, a hole transport layer, an electron blocking layer, a hole blocking layer, an electron transport layer or an electron injection layer.

Figure 11:
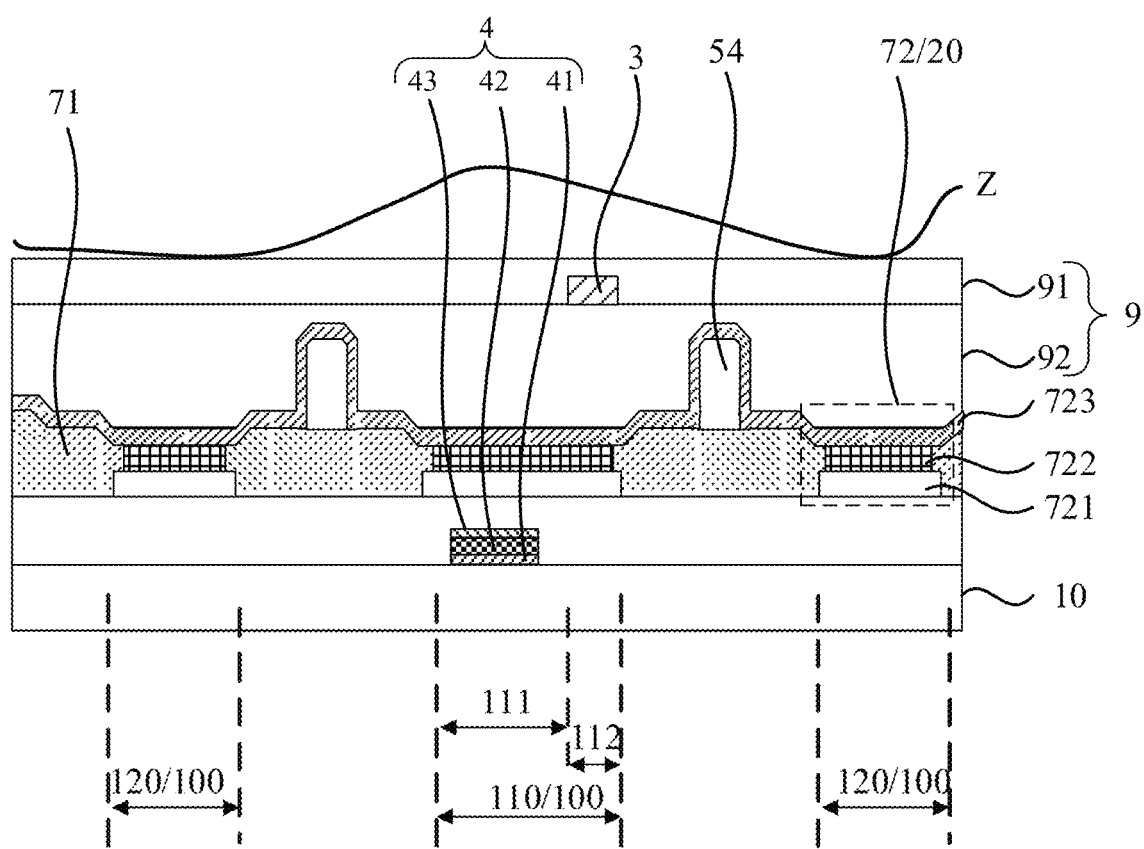
FIG. 11 is a sectional view of another display device according to an embodiment of the present disclosure.

FIG. 11 is a sectional view of another display device according to an embodiment of the present disclosure. Different from FIG. 10 in which the organic light emitting display device is encapsulated by the cover plate, FIG. 11 illustrates that the organic light emitting display device is encapsulated by the thin film. Referring to FIG. 11, the display device further includes a thin film encapsulation layer 9 on the side of the plurality of organic light emitting units 72 facing away from the first base substrate 10. The photoluminescence unit 3 is disposed within the thin film encapsulation layer 9. In other embodiments, the photoluminescence unit 3 may be disposed on the thin film encapsulation layer 9 and on a side of the thin film encapsulation layer 9 facing towards the first base substrate 10.

Exemplarily, referring to FIG. 11, the thin film encapsulation layer 9 includes a first insulating layer 91 and a second insulating layer 92, where the photoluminescence unit 3 is disposed between the first insulating layer 91 and the second insulating layer 92. The photoluminescence unit 3 is formed on the first insulating layer 91. With the first insulating layer 91, the organic luminescence unit 72 will not be damaged by the formation of the photoluminescence unit 3.

In one embodiment, referring to FIG. 9, the plurality of pixels 100 includes a first pixel 110 and a second pixel 120. The first pixel 110 includes a first region 111 and a second region 112. The photoluminescence unit 3 is disposed in the second region 112. A vertical projection of the first pixel 110 on the plane where the first base substrate 10 is located has a greater area than a vertical projection of the second pixel 120 on the plane where the first base substrate 10 is located. In the embodiment of the present disclosure, an area of the first pixel 110 is greater than an area of the second pixel 120, and the first pixel 110 includes the first region 111 for emitting the visible light and the second region 112 for emitting the invisible light. In the embodiment of the present disclosure, an area of the existing pixel 100 is increased and the photoluminescence unit 3 is disposed in a partial region of the pixel 100 whose area is increased. It is to be noted that, in the embodiments of the present disclosure, the organic light emitting display device is taken as an example for explanation and description, but the display device is not limited thereto.

In one embodiment, referring to FIG. 11, a vertical projection of the first region 111 on the plane where the first base substrate 10 is located has a same area as the vertical projection of the second pixel 120 on the plane where the first base substrate 10 is located. An area of the first pixel 110 emitting the visible light is equal to an area of the second pixel 120 emitting the visible light, and then all the pixels 100 in the display device have a same light emitting display effect.

Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:
1. A display device, comprising:
a first base substrate;
a plurality of pixels arranged in an array;
a light source, configured to emit visible light;
at least one photoluminescence unit, configured to convert the visible light emitted by the light source into invisible light;
at least one light sensing element, configured to perform fingerprint recognition according to the invisible light reflected by a touch body; and
a counter substrate, a liquid crystal layer and a backlight module; wherein the counter substrate comprises a second base substrate, the liquid crystal layer is disposed between the first base substrate and the second base substrate, and the backlight module is disposed on a side of the first base substrate facing away from the counter substrate and comprises the light source;
wherein the counter substrate further comprises a black matrix, which is disposed on a side of the second base substrate facing towards the liquid crystal layer;
wherein a vertical projection of the at least one photoluminescence unit on a plane where the second base substrate is located is within a vertical projection of the black matrix on the plane where the second base substrate is located;
wherein the counter substrate further comprises a plurality of color resists, wherein the plurality of color resists is disposed between the black matrix and the liquid crystal layer, and each of the plurality of color resists is disposed between two adjacent black matrices;
wherein a vertical projection of the at least one light sensing element on the plane where the second base substrate is located overlaps a vertical projection of a portion of the plurality of color resists within the plurality of pixels on the plane where the second base substrate is located; and
wherein each of the at least one light sensing element comprises a first electrode, a photosensitive layer and a second electrode, wherein the photosensitive layer is disposed on a side of the first electrode facing towards the second base substrate, the second electrode is disposed on a side of the photosensitive layer facing towards the second base substrate, and the first electrode and the second electrode are transparent;
wherein the display device further comprises a common electrode and a pixel electrode, wherein the common electrode and the pixel electrode are disposed between the first base substrate and the liquid crystal layer, and the pixel electrode is disposed between the common electrode and the liquid crystal layer; and
wherein the first electrode and the common electrode are arranged at a same layer and made of a same material, and the second electrode and the pixel electrode are arranged at a same layer and made of a same material.

2. The display device of claim 1, comprising: a plurality of light sensing elements, wherein a distance P between two adjacent light sensing elements satisfies 300 µm≤P≤500 µm.

3. The display device of claim 1, wherein a vertical projection of each of the at least one photoluminescence unit on a plane where the first base substrate is located has an area greater than or equal to 1500 µm2, and a vertical projection of each of the at least one light sensing element on the plane where the first base substrate is located has an area greater than or equal to 200 µm2.

4. The display device of claim 1, wherein the at least one photoluminescence unit converts the visible light into infrared light.

\* \* \* \* \*